United States Patent [19]

Hiroi et al.

[11] Patent Number: 5,015,837

[45] Date of Patent: May 14, 1991

[54] CONTACT TYPE IMAGE SENSOR WITH ELECTRIC SHIELDING

[75] Inventors: Masaki Hiroi, Sendai; Masumitsu Ino; Takehito Nagata, both of Yokohama; Masumi Shimada, Tokyo, all of Japan

[73] Assignees: Ricoh Company, Ltd., Tokyo; Ricoh Research Institute of General Electronics Co., Ltd., Natori, both of Japan

[21] Appl. No.: 427,702

[22] Filed: Oct. 27, 1989

[30] Foreign Application Priority Data

Nov. 2, 1988 [JP] Japan .................................. 63-278090

[51] Int. Cl.[5] ............................................. H01J 40/14
[52] U.S. Cl. ................................... 250/208.1; 358/482
[58] Field of Search ......................... 250/208.1, 578.1; 358/482, 483, 494; 357/30 H, 52

[56] References Cited

U.S. PATENT DOCUMENTS 4,874,957 10/1989 Sasaki et al. ..................... 250/208.1
4,908,718 3/1990 Shimada .............................. 358/482

Primary Examiner—David C. Nelms
Attorney, Agent, or Firm—Oblon, Spivak, McClelland, Maier & Neustadt

[57] ABSTRACT

A contact type image sensor includes a transparent base plate having a first surface and a second surface opposite to each other, a light receiving layer formed on the first surface of the transparent base plate, the light receiving layer generating an electric signal in response to light irradiated thereon, a driving circuit layer formed on the first surface of the transparent base plate, the driving circuit layer including a thin-film transistor for driving the light receiving member, and a conducting thin film formed on at least the second surface of the transparent base plate to thereby electrically shield the light receiving layer and the driving circuit layer.

20 Claims, 3 Drawing Sheets

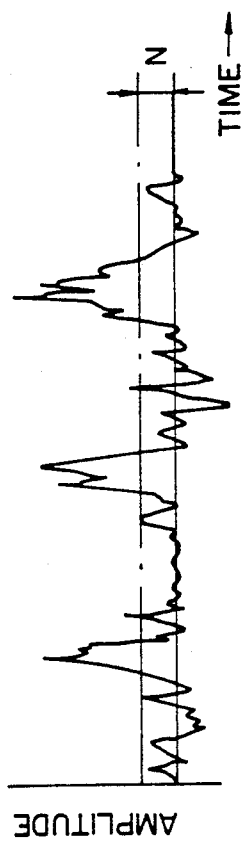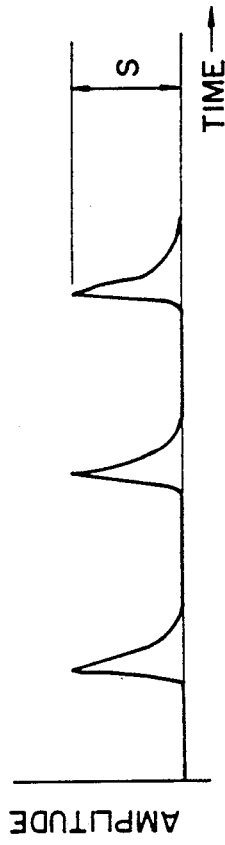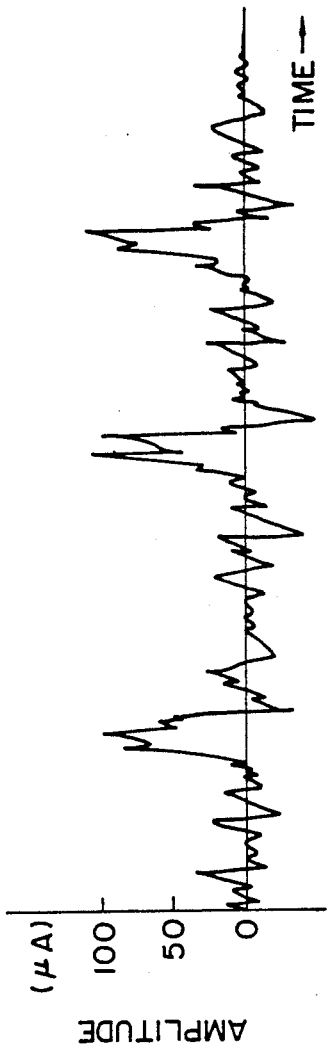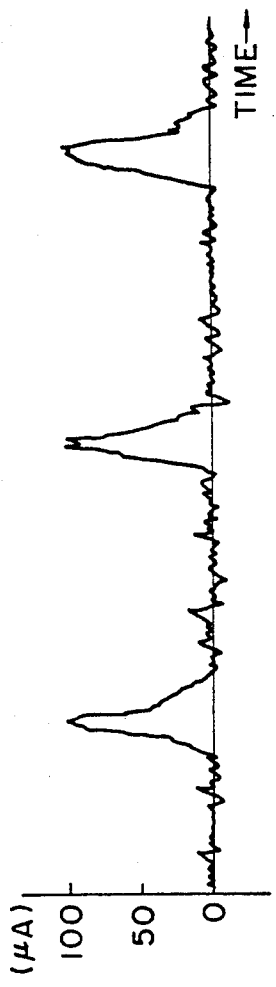
FIG.1(A) PRIOR ART
FIG.1(B) PRIOR ART
FIG.6(A)
FIG.6(B)

CONTACT TYPE IMAGE SENSOR WITH ELECTRIC SHIELDING

BACKGROUND OF THE INVENTION

The present invention generally relates to a contact type image sensor which is applicable to an optical reader provided in a copying machine, a facsimile machine or the like.

An image sensor is used in an optical reader for optically reading characters and graphics on a document. Conventionally, an image sensor includes a lens system, which prevents miniaturization of the optical reader. Recently, a full-size image sensor capable of reading a document of A4 or B4 size without magnifying an optical image of the document is available.

Generally, a full-size image sensor includes a sensor part (light receiving part) and a drive circuit formed by thin-film transistors (TFTs). The sensor part and the drive circuit are integrally formed on a base. An incident light emitted from a light source enters the image sensor through a window formed therein. Then the incident light leaves the image sensor and is irradiated onto a document to be scanned and then reflected thereby. The reflected light enters the image sensor again, and is irradiated onto the light receiving part thereof. The image sensor except the window is covered by a light interrupting member used for interrupting the incident light. Particularly, the light receiving part of the image sensor must be completely covered by the light interrupting member so that no incident light is irradiated directly onto the light receiving part.

However, currently available full-size image sensors have the following disadvantages. FIG.1(A) is a waveform diagram of an output signal derived from a conventional full-size image sensor. A letter N indicates noise contained in the sensor output. FIG.1(B) is a waveform diagram of an ideal sensor output S having no noise. It can be seen from FIG.1(A) and FIG.1(B) that the signal-to-noise ratio of the sensor output from the conventional full-size image sensor is poor. Thus, it is difficult to read the document with high precision.

SUMMARY OF THE INVENTION

Accordingly, a general object of the present invention is to provide a contact (full-size) type image sensor without the aforementioned disadvantages.

A more specific object of the present invention is to provide a contact type image sensor capable of providing a sensor output of an improved signal-to-noise ratio.

The above-mentioned objects of the present invention are achieved by a contact type image sensor comprising a transparent base plate having a first surface and a second surface opposite to each other; a light receiving layer formed on the first surface of the transparent base plate, the light receiving layer generating an electric signal in response to light irradiated thereon; a driving circuit layer formed on the first surface of the transparent base plate, the driving circuit layer including a thin-film transistor for driving the light receiving member; and a conducting thin film formed on at least the second surface of the transparent base plate to thereby electrically shield the light receiving layer and the driving circuit layer.

The aforementioned objects of the present invention are achieved by a contact type image sensor comprising a conducting plate having a groove; and an assembly provided in the groove. The assembly includes a transparent base plate having a first surface and a second surface opposite to each other, a light receiving layer formed on the first surface of the transparent base plate, the light receiving layer generating an electric signal in response to light irradiated thereon, and a driving circuit layer formed on the first surface of the transparent base plate, the driving circuit layer including a thin-film transistor for driving the light receiving member. The light receiving layer and the driving circuit layer are electrically shielded by the conducting plate.

Additional objects, features and advantages of the present invention will become apparent from the following detailed description when read in conjunction with the accompanying drawings.

BRIEF DESCRIPTION OF THE DRAWINGS

FIGS.1a and 1b are waveform diagram illustrating disadvantages of conventional contact type image sensor;

FIGS.6(A) and 6(B) are waveform diagram illustrating an advantage presented by the present invention.

DESCRIPTION OF THE PREFERRED EMBODIMENTS

Figure 2A:
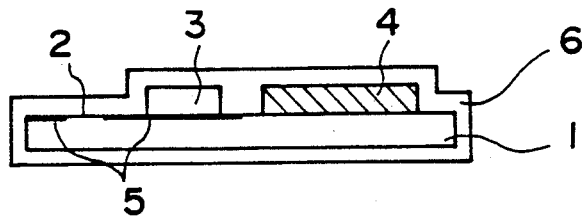
FIGS.2(A),2(B),2(C),2(D) and (E) are cross sectional views of a contact type image sensor according to an embodiment of the present invention which are taken at different manufacturing steps.

A description is given of a preferred embodiment of the present invention. FIGS.2(A) through 2(E) are cross sectional views of a contact type image sensor according to the embodiment of the present invention, which are taken at different manufacturing steps. The illustrated contact type image sensor includes a transparent base plate 1 such as a glass plate, a light passing window 2, a light receiving layer (sensor layer) 3, a thin-film transistor layer (drive circuit) 4, a light interrupting layer 5, a transparent insulating film 6, a good conductor thin film 7 grounded through a line 9, a transparent passivation film 8, and an incident light window 10. The good conductor thin film electrically shields the sensor layer 3 and the thin-film transistor layer 4.

Referring to FIG.2(A), the light interrupting layer 5 is partially formed on the transparent base plate 1 so as to form the light passing window 2. The light interrupting layer 5 is not formed on a surface portion of the transparent base plate 1 on which the thin-film transistor layer 4 is to be formed. The sensor layer 3 and the thin-film transistor layer 4 are integrally formed on the surface of the transparent base plate 1. The sensor layer 3 and the thin-film transistor layer 4 can be formed in a conventional manner. For example, the sensor layer 3 may be formed by a photoelectric conversion element using amorphous silicon disclosed in U.S. Pat. No. 4,805,032, the disclosure of which is hereby incorporated by reference. The thin-film transistor layer 4 may be formed by a thin-film transistor disclosed in U.S. Pat. application No. 269,452, now U.S. Pat. No. 4,883,766 the disclosure of which is hereby incorporated by reference. The sensor layer 3 includes a large number of photoelectric conversion elements arranged into a line, and the thin-film transistor layer 4 includes a large number of thin-film transistors forming a drive circuit for driving each of the photosensitive conversion elements. The insulating film 6 is provided so as to cover the entire structure. Incident light emitted from a light source (not shown) located on the bottom side of the image sensor in FIG.2A passes through the light passing window 2, and is then irradiated onto a document (not shown) located on the upper side of the image sensor.

Figure 2B:
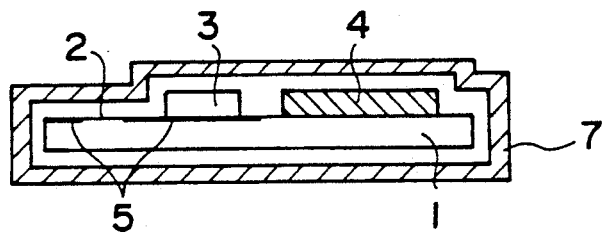

Next, as shown in FIG.2(B), the good conductor thin film 7 is formed on the entire surface of the insulating film 6. The good conductor thin film 7 is formed of a metallic member such as aluminum (Al), copper (Cu), an alloy of aluminum, silicon (Si) and copper, an alloy of aluminum and silicon, nickel (Ni), chromium (Cr), or an alloy of nickel and copper, for example. Such a metallic member is deposited on the entire surface of the insulting film 6 by an evaporation process in which the image sensor shown in FIG.2(A) is placed in vacuum. An alternative conventional deposition process may be used. It is preferable to deposit the good conductor thin film 7 to a thickness of approximately 5,000 to 20,000 angstroms.

Alternatively, the good conductor thin film 7 can be formed by a substance other than metallic materials. It is preferable to select a material having the volume resistivity equal to or less than $10^8 \Omega cm$, particularly $10^{3 \text{ } 4} \Omega cm$. For example, a semiconductor material containing an impurity, a conductive rubber, or a conductive resin is usable. An impurity such as phosphorus (P), boron (B), arsenic (As), gallium (Ga) or germanium (Ge) is deposited together with a semiconductor material. Alternatively, a semiconductor material is deposited and then an impurity is introduced into the deposited semiconductor material. A conductive rubber is a rubber mixed with carbon or metallic compounds, for example. A conductive resin is a resin exhibiting conductivity by itself, or plastic mixed with carbon or metallic compounds. A desired resistivity value can be obtained by adjusting an amount of a material to be mixed in a semiconductor material, rubber or a resin.

Figure 2C:
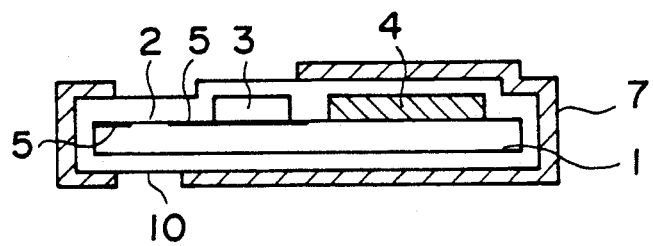

Then, as shown in FIG.2(C), portions of the good conductor thin film 7 corresponding in position to the light passing window 2, the sensor layer 3 and the incident light window 10 are removed by etching.

Figure 2D:
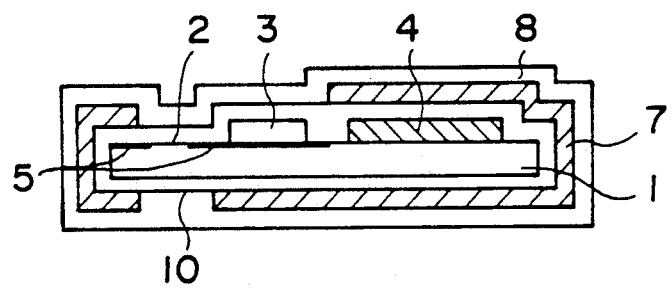
Figure 2E:
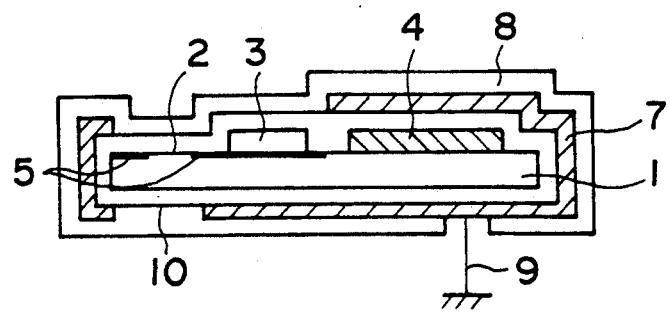

After that, as shown in FIG.2(D), the passivation film 8 is deposited on the entire surface of the image sensor shown in FIG.2(C). Subsequently, a part of the bottom portion of the passivation film 8 is removed by etching. Finally, the good conductor thin film 7 is connected to ground through the line 9. FIG.2(E) illustrates the cross section of the image sensor formed by the aforementioned production procedure.

Figure 3:
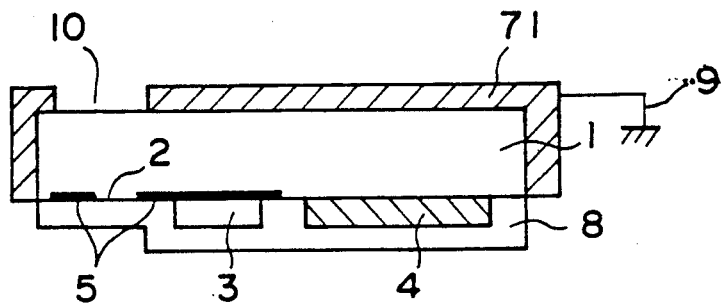
FIG.3 is a cross sectional view of a second embodiment of the present invention.

FIG.3 is a cross sectional view of a contact type image sensor according to a second embodiment of the present invention. Referring to FIG.3, a good conductor thin film 71 is integrally formed on a back surface of the transparent base plate 1 and opposite side surfaces thereof. The good conductor thin film is connected to ground through the line 9.

Figure 4:
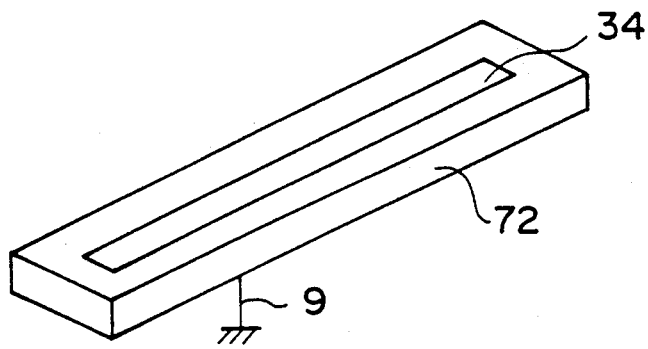
FIG.4 is a perspective view of a variation of the second embodiment of the present invention.

Alternatively, as shown in FIG.4, a groove 34 is formed in a supporting member 72 having conductivity. In the groove 34 of the conducting supporting member 72, positioned is an assembly having the sensor layer 3 and the thin-film transistor layer 4 supported by the transparent base plate 1 which has the same structure as that shown in FIG.2A. The conducting supporting member 72 has a window (not shown) through which an incident light passes. The conducting supporting member 72 is grounded.

Figure 5:
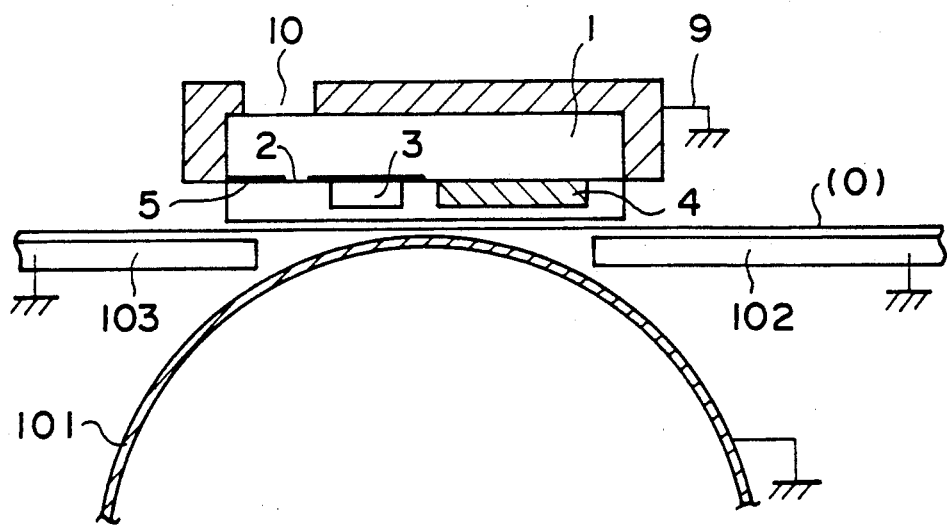
FIG.5 is a cross sectional view illustrating the image sensor shown in FIG.3 used together with a paper transport mechanism.

As shown in FIG.5, the image sensor according to the present invention is located with respect to a transport roller 101. An entrance plate 102 and an exit plate 103 are arranged so that a spacing is formed through which the transport roller 101 is partially exposed. A document (O) to be scanned is transported on the entrance and exit plates 102 and 103 by the transport drum 101 in contact with the document (O). The contact type image sensor is located above the spacing between the entrance plate 102 and the exit plate 103 so that the sensor layer 3 faces the transport drum 101.

FIG.6(A) is a waveform diagram of the sensor output supplied from the contact type image sensor shown in FIG.2(A) having no good conductor shield, and FIG.6(B) is a waveform diagram of the sensor output supplied from the contact type image sensor shown in FIG.2(E). It can be seen from FIGS.6(A) and 6(B) that the presence of the good conductor thin film 7 contributes to reducing the occurrence of noise.

The present invention is not limited to the aforementioned embodiments, and variations and modifications may be made without departing from the scope of the present invention.

What is claimed is:

1. A contact type image sensor comprising:
   a transparent base plate having a first surface and a second surface opposite to each other;
   a light receiving layer formed on said first surface of the transparent base plate, said light receiving layer generating an electric signal in response to light irradiated thereon;
   a driving circuit layer formed on said first surface of the transparent base plate, said driving circuit layer including a thin-film transistor for driving said light receiving layer; and
   a conducting thin film formed on said first surface and said second surface of the transparent base plate to thereby electrically shield said light receiving layer and said driving circuit layer.

2. A contact type image sensor as claimed in claim 1, further comprising a transparent insulating film formed so as to cover said transparent base plate, said light receiving layer and said driving circuit layer, wherein said conducting thin film is provided on said transparent insulating film.

3. A contact type image sensor as claimed in claim 2, wherein said conducting thin film has a window through which an incident light passes.

4. A contact type image sensor as claimed in claim 2, wherein said conducting thin film has a portion provided on a portion of said transparent insulating film formed on said driving circuit layer and which covers said driving circuit layer.

5. A contact type image sensor as claimed in claim 2, wherein said transparent base plate has side surfaces, and wherein said transparent insulating film has portions formed on said side surfaces, and said conducting thin film has portions formed on said portions of the transparent insulating film formed on said side surfaces.

6. A contact type image sensor as claimed in claim 1, wherein said conducting thin film is grounded.

7. A contact type image sensor as claimed in claim 1, wherein said conducting thin film comprises a metallic material.

8. A contact type image sensor as claimed in claim 1, wherein said conducting thin film comprises a semiconductor material having an impurity which gives said semiconductor material conductivity.

9. A contact type image sensor as claimed in claim 1, wherein said conducting thin film comprises a conductive rubber.

10. A contact type image sensor as claimed in claim 1, wherein said conducting thin film comprises a conductive resin.

11. A contact type image sensor as claimed in claim 1, wherein said conducting thin film is formed directly on said second surface of the transparent base plate.

12. A contact type image sensor as claimed in claim 1, wherein said transparent base plate has side surfaces, and wherein said conducting thin film has portions formed on said side surfaces of the transparent base plate.

13. A contact type image sensor as claimed in claim 1, further comprising a light interrupting member formed on a portion of said first surface of the transparent base plate, wherein said light receiving layer is formed on said light interrupting member.

14. A contact type image sensor as claimed in claim 13, wherein said light interrupting member has a window through which an incident light passes.

15. A contact type image sensor as claimed in claim 1, wherein said conducting thin film is approximately 5,000 to 20,000 angstroms in thickness.

16. A contact type image sensor as claimed in claim 1, wherein said conducting thin film has a volume conductivity equal to or less than $10^8 \Omega cm$.

17. A contact type image sensor as claimed in claim 1, further comprising a passivation film covering said conducting thin film.

18. A contact type image sensor as claimed in claim 17, wherein said passivation film has a hole through which said conducting thin film is grounded.

19. A contact type image sensor comprising:
a conducting plate having a groove; and an assembly provided in said groove, said assembly including;
a transparent base plate having a first surface and a second surface opposite to each other,
a light receiving layer formed on said first surface of the transparent base plate, said light receiving layer generating an electric signal in response to light irradiated thereon, and
a driving circuit layer formed on said first surface of the transparent base plate, said driving circuit layer including a thin-film transistor for driving said light receiving layer,
said light receiving layer and said driving circuit layer being electrically shielded by said conducting plate.

20. A contact type image sensor as claimed in claim 19, wherein said conducting plate is grounded.

* * * * *